United States Patent [19]

Kirby

[11] 4,260,849
[45] Apr. 7, 1981

[54] LOW COST GROUNDING HANGER ASSEMBLY

[75] Inventor: Robert E. Kirby, Garner, N.C.

[73] Assignee: Telex Computer Products, Inc., Raleigh, N.C.

[21] Appl. No.: 37,156

[22] Filed: May 8, 1979

[51] Int. Cl.³ ............................ H05K 7/18; H02B 1/16
[52] U.S. Cl. ........................................ 174/51; 361/331; 361/427; 24/73 B; 174/35 GC
[58] Field of Search ............... 174/66, 35 MS, 35 GC, 174/51; 220/318, 324, 326; 361/331, 399, 422, 424, 427, 429; 339/14 R, 258 R; 292/17, 76; 24/73 B, 259 R, 236

[56] References Cited

U.S. PATENT DOCUMENTS

| Re. 28,035 | 6/1974 | Fork | 174/51 |
|---|---|---|---|
| 2,946,838 | 7/1960 | Bellek | 174/66 |
| 3,066,367 | 12/1962 | Garman | 361/427 |
| 3,723,942 | 3/1973 | Dennison | 339/14 R |
| 4,026,622 | 5/1977 | Siciliano | 339/258 R |
| 4,069,618 | 1/1978 | Geiss | 174/35 MS |

Primary Examiner—Gerald P. Tolin
Attorney, Agent, or Firm—Head & Johnson

[57] ABSTRACT

Apparatus for removably supporting and electrically grounding a cover to a base structure, having an upper and lower attachment assembly, the lower assembly having a hanger with a horizontal portion and an integral vertical portion, a leaf spring of inverted V-shaped configuration with a vertical leg affixed to the base structure and an angular leg extending to normally resiliently engage the hanger vertical portion, a lower bracket affixed to the cover having a horizontal leg and an integral vertical portion at the leg outer end, the horizontal leg having an opening to receive the hanger vertical portion, the upper assembly having a hanger with a horizontal portion with an opening therein, a leaf spring of inverted V-shaped configuration having an angular leg extending downwardly through the opening, and an upper bracket affixed to the cover having a downward extending vertical portion, the upper and lower hangers engaging the upper and lower brackets and the springs of the upper and lower hangers being resiliently displaced by the brackets vertical portions to provide positive engagement with the brackets and thereby attain positive grounding contact between the base structure and the cover.

7 Claims, 4 Drawing Figures

LOW COST GROUNDING HANGER ASSEMBLY

I. FIELD OF THE INVENTION

This invention relates to apparatus for removably supporting a cover to a base structure and providing positive grounding connection between the structure and the cover.

II. DESCRIPTION OF THE PRIOR ART

Many types of electric and electronic apparatus require that all structural components be connected to each other with a low resistance ground to provide electrostatic discharge between components as well as to provide electromagnetic and radio frequency interference shielding. Where parts are secured to each other by nuts, bolts, welding and the like, grounding is automatically achieved in most cases. The problem exists, however, to provide grounding between one component of a structure which is removably attached to the structure. In the past the typical means of providing grounding for a cover assembly for an electrical or electronic product has usually been accomplished by electroplating the entire cover assembly. When the cover assembly is to be painted, the portions required to make grounding contact are masked. Grounding is achieved at these paint-free areas on the cover to paint-free areas on the chassis or base structure through grounding springs or grounding straps.

While the usual method frequently employed as abovedescribed is by and large successful in obtaining necessary grounding, it is time consuming in production and therefore costly. The present invention is directed towards apparatus for removably attaching and supporting one component to another, such as a cover to a chassis, in which the cover is easily removable and yet wherein positive, low resistance grounding is automatically achieved when the cover is positioned on the chassis.

Others have provided devices to attach one component to another to achieve electrical connection as exemplified in U.S. Pat. Nos. 4,026,622; 3,895,267; and 3,810,069. However the devices illustrated in these prior issued patents do not accomplish the dual purpose of removably supporting a cover to a chassis while simultaneously and automatically providing positive low resistance grounding between the two components.

SUMMARY OF THE INVENTION

The invention provides a means for removably supporting a cover to the vertical surface of a base structure or chassis. The apparatus includes an upper attachment assembly and a lower attachment assembly. The lower attachment assembly has a hanger with a horizontal portion affixed at one end to the chassis and having a vertical portion integrally extending from the other end. A leaf spring of inverted V-shaped configuration has a vertical leg which is attached to the chassis vertical surface and an integrally outwardly extending angular leg which extends out to normally resiliently engage the hanger vertical portion. Affixed to the cover is a bracket having a horizontal portion, the inner end being attached to the cover and the outer end having an integral upwardly extending vertical portion. An opening is provided in the bracket horizontal portion to receive the vertical portion of the hanger.

The upper support assembly has a hanger affixed to the chassis having a horizontal portion with an opening therein. A leaf spring of inverted V-shaped configuration has a vertical leg affixed to the chassis and an integral downwardly extending angular leg which extends through the opening in the hanger. An upper bracket is affixed to the cover and has an integral downwardly extending portion.

When the hanger is attached to the chassis the vertical portion of the lower hanger extends through the opening in the lower bracket and the spring resiliently engages the lower bracket vertical portion. The vertical portion of the upper bracket extends through the opening in the upper hanger and resiliently engages the angular leg of the upper spring. The cover is thereby removably supported to the chassis and at the same time positive low resistance grounding is insured by the upper and lower springs.

DESCRIPTION OF THE VIEWS

DESCRIPTION OF THE PREFERRED EMBODIEMENT

Figure 1:
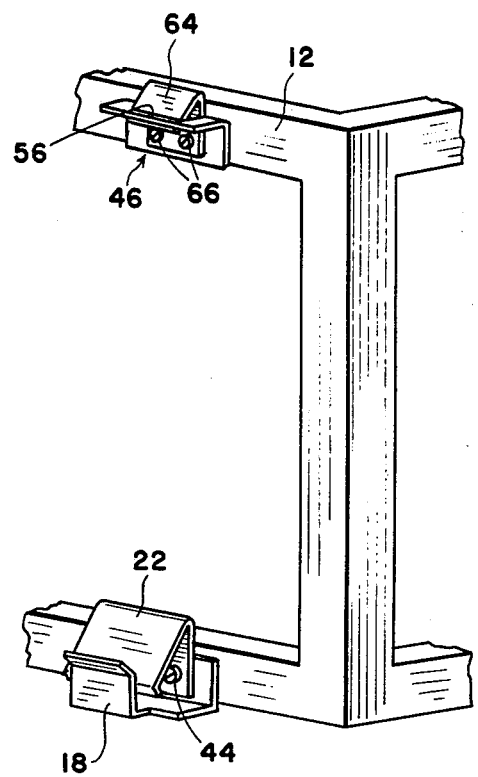
FIG. 1 is an isometric drawing showing portions of a chassis or base structure and showing upper and lower hangers and the upper and lower springs.
Figure 2:
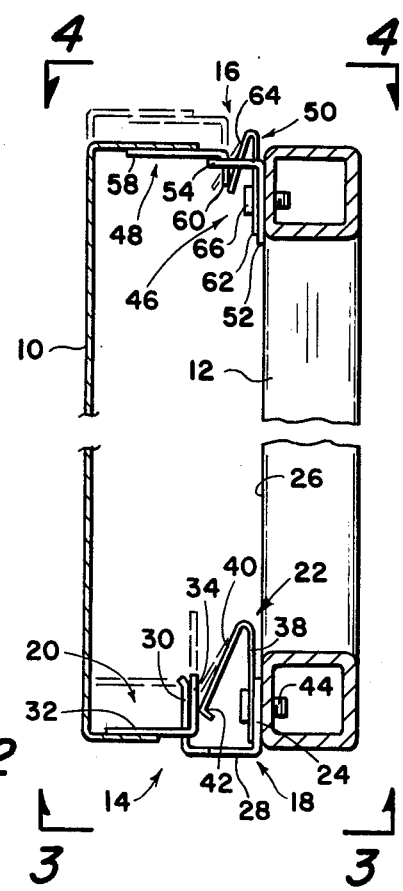
FIG. 2 is a cross-sectional view showing a cover in cross section and showing the cover in place supported on upper and lower hanger assemblies with the position of the cover in the attitude preparatory to attaching it to the chassis being shown in dotted outline.

Referring to FIGS. 1 and 2, an embodiment of the invention is illustrated. The invention is a means of providing removable support of a cover 10 to a base structure or chassis 12. To accomplish this objective a lower attachment assembly, generally indicated by 14 and an upper attachment assembly generally indicated by the numeral 16 are disclosed.

Turning first to the lower attachment assembly 14, three basic components are employed, that is: a lower hanger generally indicated by the numeral 18, a lower bracket generally indicated by the numeral 20, and a lower spring generally indicated by the numeral 22.

Hanger 18 is of U-shaped cross-sectional configuration including a first vertical portion 24 affixed to the frame vertical surface 26. Extending integrally from the vertical portion 24 is a horizontal portion 28 and integrally affixed at the outer end of the horizontal portion 28 is a hanger second vertical portion 30.

Figure 3:
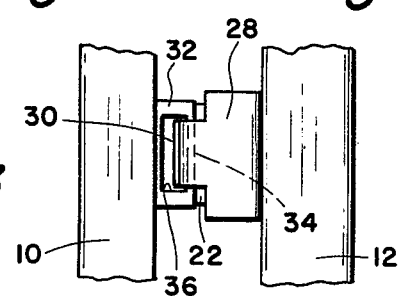
FIG. 3 is a bottom partial view of the chassis and cover showing the lower hanger assembly.

The lower bracket 20 has a horizontal portion 32 attached to cover 10 and, at the outer end thereof, an integral vertical portion 34. An opening 36 (see FIG. 3) is provided in the bracket horizontal portion 32 adjacent vertical portion 30, the opening being of a dimension to slidably receive the hanger vertical portion 30.

Spring 22 is a leaf spring of inverted V-shaped cross-sectional configuration. The spring includes a vertical leg 38 and a downwardly and outwardly inclined angular leg 40, the outer end of leg 40 normally resiliently engaging the hanger vertical portion 30. The outer end of angular leg 40 is bent at 42. The spring vertical leg 38 and the hanger vertical portion 24 are held to the chassis vertical surface 26 by means of screws 44.

Turning now to the upper attachment assembly 16. It includes three basic elements, that is, an upper hanger generally indicated by the numeral 46, an upper bracket 48, and an upper spring 50.

Figure 4:
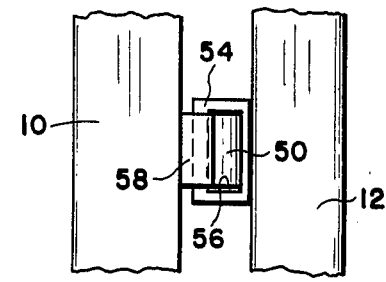
FIG. 4 is a top partial view of the chassis and cover showing a top view of the upper support assembly.

The upper hanger 46 is of L-shaped cross-sectional configuration having a vertical portion 52 secured to the chassis vertical surface 26. At the upper end of the vertical portion 52 is an integral horizontal portion 54. An opening 56 is formed in the horizontal portion (see FIG. 4).

The upper bracket includes a horizontal portion 58 attached to the cover 10 and the integral downwardly extending vertical portion 60.

Upper spring 50, like lower spring 22, is a leaf spring of inverted V-shaped cross-sectional configuration and has a vertical leg 62 and a downwardly inclined, outwardly extending, angular leg 64. Leg 64 extends through the opening 56 in the upper hanger horizontal portion and in a directional way from the bracket vertical portion 52. Spring vertical leg 62 and upper hanger 46 are both supported to the chassis 12 by means of screws 66.

When cover 10 is to be positioned in place on chassis 12, lower bracket 20 is positioned so that the lower hanger vertical portion 30 extends through the opening 36. This can be done while the cover 10 is tilted outwardly so that alignment of the opening 36 with the upper end of the lower hanger vertical portion 30 is easily accomplished. Once the lower bracket 20 is inserted past the upper end of the lower hanger vertical portion 30 the cover 10 may be tilted towards the vertical position as shown in dotted outline in FIG. 2, and slid downwardly so that the upper bracket vertical portion 60 moves into the opening 56 in the upper hanger horizontal portion 54. As the upper and lower brackets slide downwardly as the cover 10 is moved downwardly, positive engagement is made with the lower spring angular leg 40 and upper spring angular leg 64. The springs 22 and 50 not only serve to hold the cover 10 in place in a manner to prevent vibration but, most significantly, provides positive grounding between the cover 10 and chassis 12.

In the preferred embodiment the brackets and hangers are zinc coated or otherwise formed of materials to provide good, low resistance electrical contact and the upper and lower springs are of stainless steel or other material providing permanent resiliency and good conductivity. Thus the design not only secures and positions the cover 10 but also affords a low cost assembly that provides positive low resistance grounding.

While the invention has been described with a great deal of particularity it is manifest that many changes may be made in the details of construction and the arrangement of components without departing from the spirit and scope of this disclosure. The invention is not limited to the embodiment set forth herein for purposes of exemplification, but is to be limited only by the scope of the attached claim or claims, including the full range of equivalency to which each element thereof is entitled.

What is claimed is:

1. An apparatus which removably supports a cover to a vertical surface of a base structure, comprising:
    a hanger having a horizontal portion and a vertical portion, one end of the horizontal portion being secured to the base vertical surface and said vertical portion integrally extending from the other end, the vertical portion being spaced from and parallel the base structure vertical surface;
    a spring member of inverted V-shape configuration having a vertical leg affixed to the base structure vertical surface parallel and opposite said hanger vertical portion, and having an angular leg extending to normally resiliently engage said hanger vertical portion; and
    a bracket having a horizontal portion, the inner end of which is affixed to the cover, and having an integral vertical portion at the outer end, the horizontal portion having an opening therein adjacent the vertical portion, the opening receiving said hanger vertical portion,
    whereby said bracket is secured to said hanger by inserting said hanger vertical portion through said opening, said bracket and hanger vertical portions being thereby parallel and contiguous each other, said spring angular leg being inwardly displaced by said bracket vertical portion to provide resilient engagement of said bracket and said spring.

2. An apparatus which removably supports a cover to a vertical surface on a base structure according to claim 1 wherein said hanger, said spring and said bracket are of conductive material, the apparatus providing positive electrical grounding between the cover and base structure.

3. An apparatus which removably supports a cover to a vertical surface on a base structure according to claim 1 wherein said hanger is of U-shaped configuration having a second vertical portion parallel and spaced from said first mentioned vertical portion, and wherein said second vertical portion is attached to the base vertical surface and wherein said spring vertical leg is attached to said hanger second vertical portion.

4. An apparatus which removably supports a cover to the vertical surface of a base structure, comprising:
    a hanger having a horizontal portion, the inner end of which is secured to the base vertical surface, the horizontal portion having an opening therein;
    a spring of inverted V-shape configuration having a vertical leg supported on the base structure vertical surface and having an integral angular leg extending downwardly and away from the plane of the base structure vertical surface, the upper portions of the spring vertical and angular legs being received in said opening in said hanger; and
    a bracket having a horizontal portion, the inner end of which is affixed to the cover, and a downwardly extending vertical portion integrally extending from the horizontal portion outer end,
    whereby said bracket is secured to said hanger by inserting the bracket vertical portion in said opening in said hanger horizontal portion and displacing the cover downwardly, the bracket vertical portion engaging and resiliently displacing said spring angular leg.

5. An apparatus which removably supports a cover to a vertical surface on a base structure according to claim 4 wherein said hanger, said spring and said bracket are all of conductive material, the apparatus providing positive electrical grounding between the cover and base structure.

6. An apparatus which removably supports a cover to a vertical surface on a base structure, comprising:
    a lower hanger having a horizontal portion and a vertical portion, one end of the horizontal portion being secured to the base vertical surface and said vertical portion integrally extending from the other end, the vertical portion being spaced from and parallel the base structure vertical surface;

a lower spring member of inverted V-shape configuration having a vertical leg affixed to the base structure vertical surface parallel and opposite said lower hanger vertical portion, and having an angular leg extending to normally resiliently engage said lower hanger vertical portion; and a lower bracket having a horizontal portion, the inner end of which is affixed to the cover, and having an integral vertical portion at the outer end, the horizontal portion having an opening therein adjacent the vertical portion, the opening receiving the lower hanger vertical portion;

an upper hanger having a horizontal portion, the inner end of which is secured to the base vertical surface, the horizontal portion having an opening therein;

an upper spring of inverted V-shape configuration having a vertical leg supported on the base structure vertical surface and having an integral angular leg extending downwardly and away from the plane of the base structure vertical surface, the upper portions of the spring vertical and angular legs being received in said opening in said upper hanger; and an upper bracket having a horizontal portion, the inner end of which is affixed to the cover, and a downwardly extending vertical portion integrally extending from the horizontal portion outer end;

whereby said lower bracket is secured to said lower hanger by inserting said lower hanger vertical portion through said opening, said lower bracket and hanger vertical portions being thereby parallel and contiguous each other, said lower spring angular leg being inwardly displaced by said lower bracket vertical portion and providing resilient engagement of said bracket and said spring; and whereby said upper bracket is secured to said upper hanger by inserting the upper bracket vertical portion in said opening in said upper hanger horizontal portion prior to the cover being displaced downwardly, the bracket vertical portion engaging and resiliently displacing said upper spring angular leg.

7. An apparatus which removably supports a cover to a vertical surface on a base structure according to claim 6 in which said upper and lower hangers, said upper and lower brackets, and said upper and lower springs are of conductive material, the apparatus providing positive electrical grounding between the cover and base structure.

* * * * *